(12) United States Patent
Tran et al.

(10) Patent No.: US 10,234,896 B2
(45) Date of Patent: Mar. 19, 2019

(54) DISPLAY ASSEMBLY AND INTERFACE FOR A COMMUNICATION DEVICE

(71) Applicant: MOTOROLA SOLUTIONS, INC, Schaumburg, IL (US)

(72) Inventors: Chi T Tran, Weston, FL (US); Jorge L Garcia, Plantation, FL (US); Scott H Richards, Plantation, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 203 days.

(21) Appl. No.: 14/094,162

(22) Filed: Dec. 2, 2013

(65) Prior Publication Data

US 2015/0153763 A1   Jun. 4, 2015

(51) Int. Cl.
| | |
|---|---|
| *G06F 1/16* | (2006.01) |
| *G06F 3/01* | (2006.01) |
| *G06F 3/041* | (2006.01) |
| *G02F 1/1333* | (2006.01) |
| *H04M 1/02* | (2006.01) |
| *H04M 1/23* | (2006.01) |

(Continued)

(52) U.S. Cl.
CPC .......... *G06F 1/16* (2013.01); *G02F 1/133308* (2013.01); *G06F 1/1643* (2013.01); *G06F 3/016* (2013.01); *G06F 3/0412* (2013.01); *G06F 3/0414* (2013.01); *H04M 1/0266* (2013.01); *H04M 1/23* (2013.01); *H05K 1/028* (2013.01); *G02F 2001/133311* (2013.01); *H04M 1/18* (2013.01); *H05K 2201/10053* (2013.01)

(58) Field of Classification Search
CPC .... G06F 1/1643; G06F 3/0412; G06F 3/0414; G02F 1/13338
See application file for complete search history.

(56) References Cited

U.S. PATENT DOCUMENTS

| | | | | |
|---|---|---|---|---|
| 5,804,780 | A | * | 9/1998 | Bartha .................. H01H 9/181 200/5 A |
| 6,140,987 | A | | 10/2000 | Stein et al. |
| 6,297,810 | B1 | | 10/2001 | Anderson |

(Continued)

FOREIGN PATENT DOCUMENTS

| | | |
|---|---|---|
| EP | 1691263 A1 | 8/2006 |
| EP | 2026175 A1 | 2/2009 |

(Continued)

OTHER PUBLICATIONS

Corresponding International Application No. PCT/US2014/-66350— International Search Report with Written Opinion = dated Mar. 18, 2015.

*Primary Examiner* — Jessica M Merlin
(74) *Attorney, Agent, or Firm* — Barbara R. Doutre (57) ABSTRACT

A display (110) providing a tactile display user interface is provided. A display sub-assembly (204) with lens (104) is mounted within an internal frame (218) having a base (214). A perimeter seal (208) is mounted between the lens (104) and the internal frame (218). Mechanical switches (210) are disposed between a back surface of the display and the base (214) of the internal frame (218). The display sub-assembly (204) and lens (104) is moveable relative to the internal frame (218) resulting in actuation of a single mechanical switch in response to the display being pressed. Sealing of the lens (104) to the internal frame (218) being maintained during switch actuation.

30 Claims, 6 Drawing Sheets

(51) Int. Cl.
  *H05K 1/02*  (2006.01)
  *H04M 1/18*  (2006.01)

(56) References Cited

U.S. PATENT DOCUMENTS

| | | |
|---|---|---|
| 7,422,784 B2 | 9/2008 | Furukawa et al. |
| 8,339,250 B2 | 12/2012 | Je et al. |
| 2006/0250377 A1* | 11/2006 | Zadesky ............... G06F 1/1613 345/173 |
| 2008/0202824 A1* | 8/2008 | Philipp .................... G06F 3/02 178/18.01 |
| 2010/0090813 A1* | 4/2010 | Je ........................... G06F 3/016 340/407.2 |
| 2010/0090814 A1* | 4/2010 | Cybart ................... G06F 3/016 340/407.2 |
| 2010/0110017 A1 | 5/2010 | Lee |
| 2010/0128194 A1* | 5/2010 | Cho .................. G02F 1/133615 349/58 |
| 2011/0048909 A1* | 3/2011 | Clark ..................... H01H 9/181 200/330 |
| 2011/0141052 A1* | 6/2011 | Bernstein ................ G06F 3/016 345/174 |

FOREIGN PATENT DOCUMENTS

| | | |
|---|---|---|
| EP | 1691263 A1 | 8/2011 |
| EP | 2518595 A1 | 10/2012 |
| JP | 2003015796 A | 1/2005 |
| WO | 9829886 A1 | 7/1998 |
| WO | 2007057266 A1 | 5/2007 |
| WO | 2011097356 A1 | 8/2011 |
| WO | 2012089577 A1 | 7/2012 |

* cited by examiner

Figure 2:
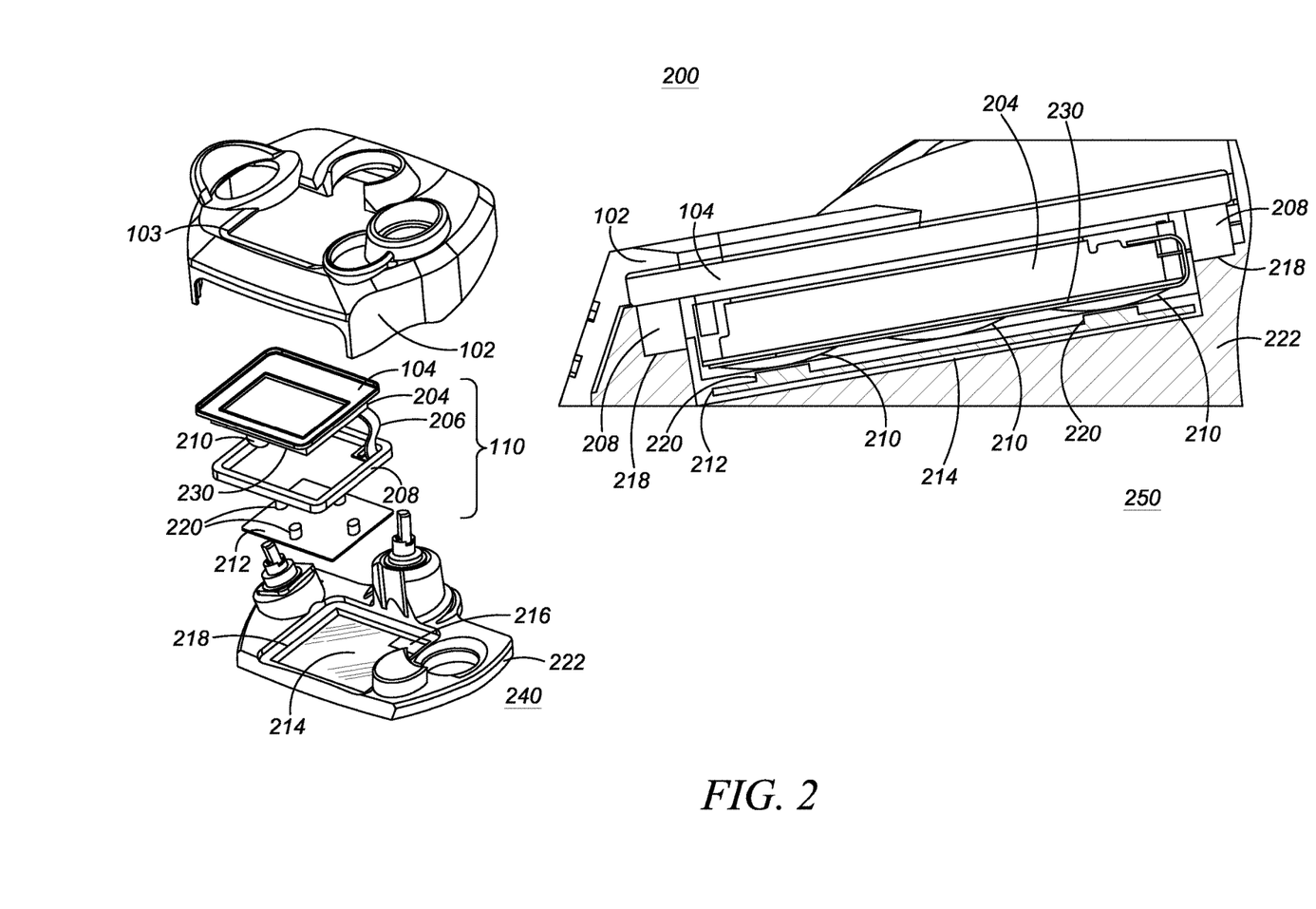
FIG. 2 shows display assemblies for a display in both a break-away view and a cross-sectional stacked view in accordance with the various embodiments.

FIG. 6 with similar non-touch display behavior. The display sub-assembly 204 is coupled to the inner surface of the lens 104 using for example a pressure sensitive adhesive (PSA) film 206. The lens 104 and display sub-assembly 204 are sealed to the housing 102 via a gasket 208. The gasket 208 may be formed of an elastomer material and provides a compressibility feature in conjunction with a spring element 216 to be described later.

DISPLAY ASSEMBLY AND INTERFACE FOR A COMMUNICATION DEVICE

FIELD OF THE DISCLOSURE

The present invention relates to portable communication devices and more particularly, to displays and display interfaces associated such devices.

BACKGROUND

Portable communication devices, such as two-way radios used in the public safety environment, often utilize displays as part of a user interface. The typical radio display comprises a liquid crystal display (LCD) covered with a glass lens. Another type of display, used on more consumer-type devices, is the touch screen display. The use of touch screen displays is growing in popularity as they provide a user with additional interface options through the use of capacitive or resistive elements within the display. However, touch screen displays are prone to failure in moisture and dirt prone surroundings and offer insufficient tactile feedback for certain rugged conditions encountered in the public safety environment. Touch screen displays are also prone to cracking or breakage if dropped under cold temperature extremes, and are not suitable for gloved usage.

A display that would provide additional user interface features to a public safety radio would be beneficial to the user. For example, a display that would allow for gloved usage and provide the ruggedness to resist abrasion, discoloration, and hazing would be highly advantageous to radios operating within the public safety environment.

Accordingly, it would be desirable to have a display with increased user interface options for a public safety radio or other electronic device operating within ruggedized environments.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Briefly, there is provided herein a display which provides a tactile display interface for an electronic device, such as a portable radio. The assembly formed in accordance with the various embodiments provides for an extended user interface by providing switch contacts beneath the display for user selectivity. The display assembly is movable and provides tactile feedback in response to being pressed, making it advantageous for gloved usage. The assembly is sealed against moisture and dirt and is resistant to breakage during drop even at cold temperatures making it well suited for a ruggedized environment, such as a public safety environment.

Figure 1:
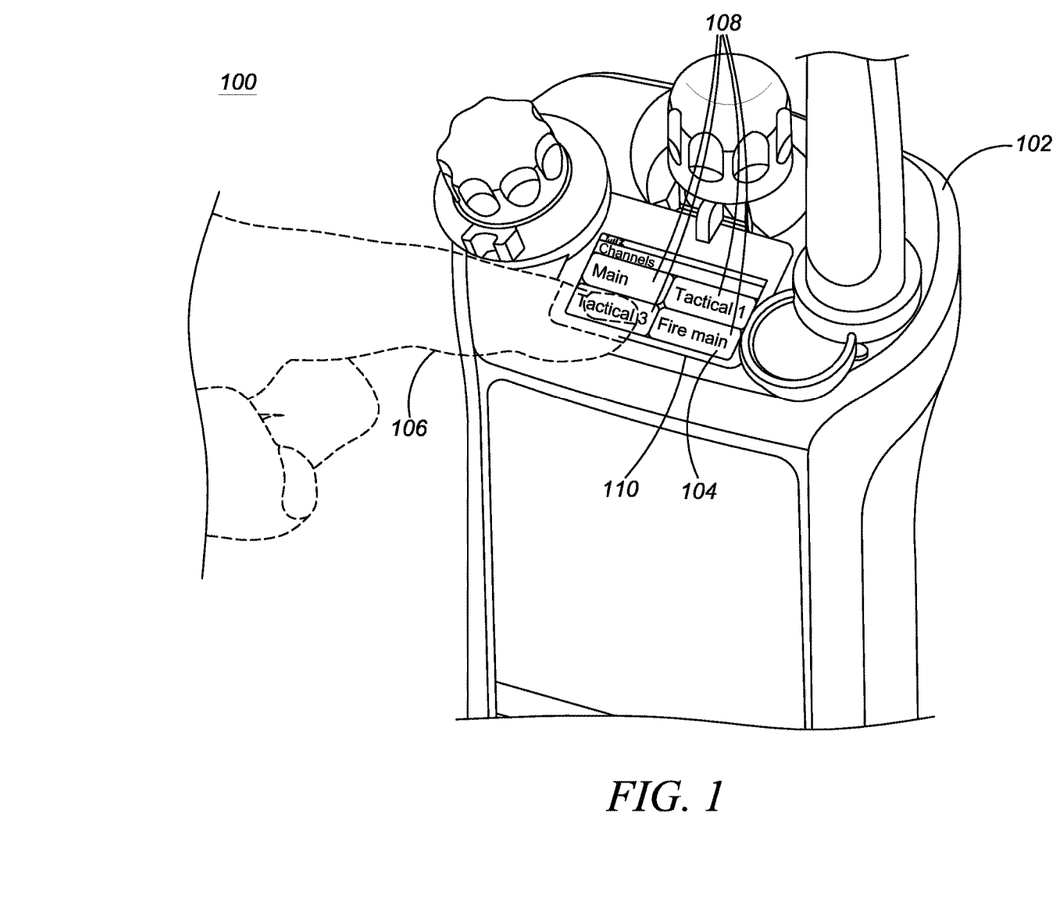
FIG. 1 is a portable radio having a display formed and operating in accordance with the various embodiments.

FIG. 1 is a portable radio having a moveable display formed and operating in accordance with the various embodiments. Portable radio 100 comprises a housing 102 having a display 110, the display being moveable and providing a tactile display interface responsive to being pressed 106. The display 110 provides a user interface featuring a plurality of actuations zones 108, shown in this embodiment as quadrants. These actuation zones are achieved through the use of switch contact placement at four corners of the display assembly. Other actuation zone configurations are also possible and will be discussed later.

The display 110 allows control actuation by depressing any selected actuation zone. The display 110, formed in accordance with the various embodiments, relies on the physical movement, or travel, of the entire display assembly, unlike resistive or capacitive elements used in touch screen displays. Each actuation zone 108 of the display 110 corresponds with a separate underlying mechanical switch (shown later). When the outer surface of the display 110 is depressed, the corresponding switch contact is actuated. The display 110 is compressibly sealed which allows for movement while protecting the system against moisture and dust intrusion as well as providing protection against drop impact. During actuation of an actuation zone 108, the display 110 rocks diagonally from corner to corner. The diagonal rocking is achieved through the four corner placement of the switch contacts as will be discussed in conjunction with FIG. 5. The display 110 advantageously remains sealed during actuation.

FIG. 2 shows display assemblies 200 for the display 110 in both a break-away view 240 and a cross-sectional stacked view 250 in accordance with the various embodiments. Referring to both views, the display assembly comprises housing 102, lens 104 with display sub-assembly 204 coupled thereto, and a chassis 222. The chassis 222 provides an internal frame 218 with base 214, also referred to as a chassis cradle.

The display sub-assembly 204 is preferably a non-touch type display, such as a liquid crystal display (LCD) and is understood in the art to include a rear light guide, rigid support and frame, however for ease of representation the display sub-assembly 204 is shown as one element. The lens 104 is preferably a glass lens. The display sub-assembly 204 could also be embodied as other non-touch type displays, such as an OLED display in a support frame or an E-Ink display. OLED displays do not require a light guide as they are transmissive.

A flexible printed circuit board (pcb flex) 230 is adhered to a bottom surface of the display sub-assembly 204. The pcb flex 230 will also be referred to as a display flex pcb 230 or flex substrate 230. In accordance with the various embodiments, the display pcb flex 230 has a plurality of switch contacts 210 disposed thereon in addition to providing display interconnect. The plurality of switch contacts 210 may be, for example, dome switches which deflect in response to being actuated. The display 110 can travel, or float, by a predetermined distance between the housing 102 and chassis cradle to actuate the dome switches 210. For example, the dome switches 210 may need a predetermined travel distance of 0.2 mm for actuation.

The display 110 further comprises a perimeter seal 208, such as an adhesive closed cell foam pad, to seal the glass lens 104 to the chassis 222. The perimeter seal 208 should be selected to provide sufficient compliance to allow for the deflection needed by the dome switches 210. For example a very high bonding pad with strong adhesive can be used to provide compliance and a good seal to minimize intrusion of water and dust.

The display assembly further comprises a compliant actuation substrate 212 having a plurality actuators 220 disposed thereon. Each actuator aligns with a corresponding dome switch on the pcb flex 230. The plurality of actuators may be formed for example, as actuator posts. The compliant actuation substrate 212 is seated within the chassis cradle on the base 214 and is selected for compliance to resist impact.

In accordance with the various embodiments, the display sub-assembly 204 has an electronic interconnect ribbon flex 206 extending therefrom for interconnecting to the internal workings of an electronic device. As mentioned previously, the chassis 222 comprises an internal frame 218 and a chassis base 214, the internal frame 218 and base 214 forming the chassis cradle. The chassis base 214 has an opening 216 providing a pass-through for the electronic interconnect ribbon flex 206 for interconnection to radio electronics. The compliant actuation substrate 212 is seated within the chassis cradle, upon the chassis base 214 as the perimeter seal 208 seals to the internal frame 218. The compliant actuation substrate 212 is thus disposed between the sealed frame, base 214 and the dome switches 210. Compliant actuation substrate 212 also acts as a shock absorber pad for impact. Thus, the dome switches 210, actuator posts 220, and electronic interconnect ribbon flex 206 are completely sealed by the chassis cradle and perimeter seal 208 adhesively coupled to internal frame 218 of the chassis. Sealing is maintained during switch actuation 210.

Although not required, the display 110 may further take advantage of a bezel 103, for example a bezel of radio housing 102. The bezel 103 can be used to maintain the perimeter seal 208 in a loaded state for improved sealing performance and cold temperature drop.

The placement of the contact switches 210 and actuator posts 220 in FIG. 2 are located mid-span along the display assembly. As will be discussed later in conjunction with FIG. 4, this mid-span placement of the switch contacts on the display assembly also provides for four actuation zones, however these four actuation zones are located in different regions of the display than the quadrants shown in FIG. 1. Mid-span placement of the switch contacts 210 allows for the display 110 to rock back and forth and from side to side. Sealing is maintained by perimeter seal 208 during switch actuation as the display 110 rocks back and forth and from side to side.

Figure 3:
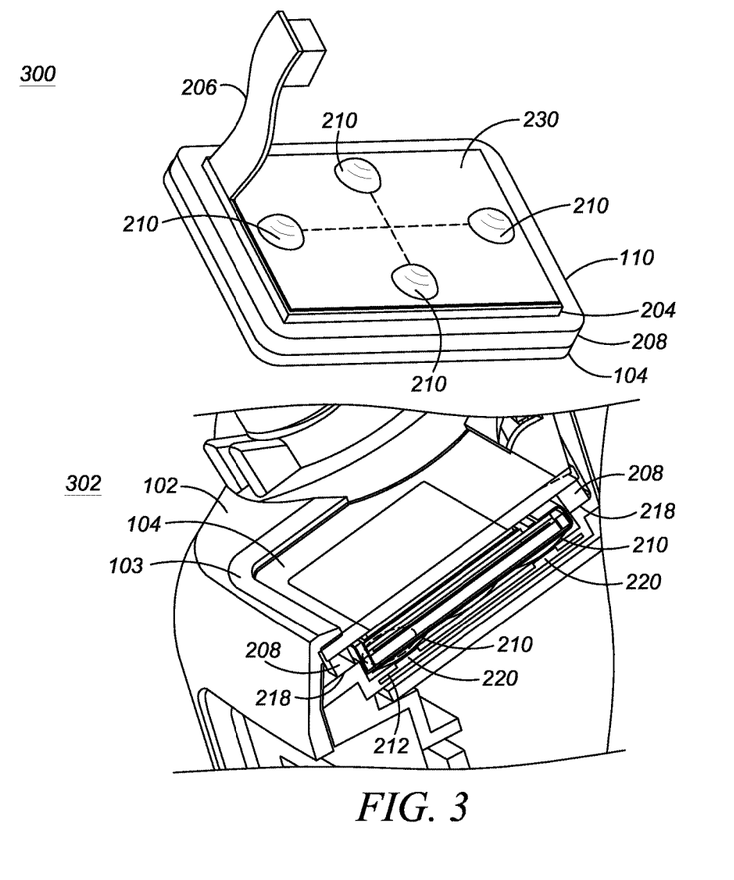
FIG. 3 shows a back view of an assembled display with cross sectional side view of the assembly within an electronic device formed in accordance with the various embodiments.

FIG. 3 shows a back view 300 of display 110 in accordance with the various embodiments. Another cross-sectional view 302 is provided for ease of reference. Back view 300 shows the display 110 having glass lens 104, perimeter seal 208, and display sub-assembly 204, such as the LCD sub-assembly, from which electronic interconnect ribbon flex 206 extends. The back surface of the display sub-assembly 204 has pcb flex 230 disposed thereon to provide an interconnect between the domes switches 210 and electronic interconnect ribbon flex 206. In this view, the four rear facing dome switches 210 are located mid-span, other arrangements, such as four corner placement, are also possible.

Figure 4:
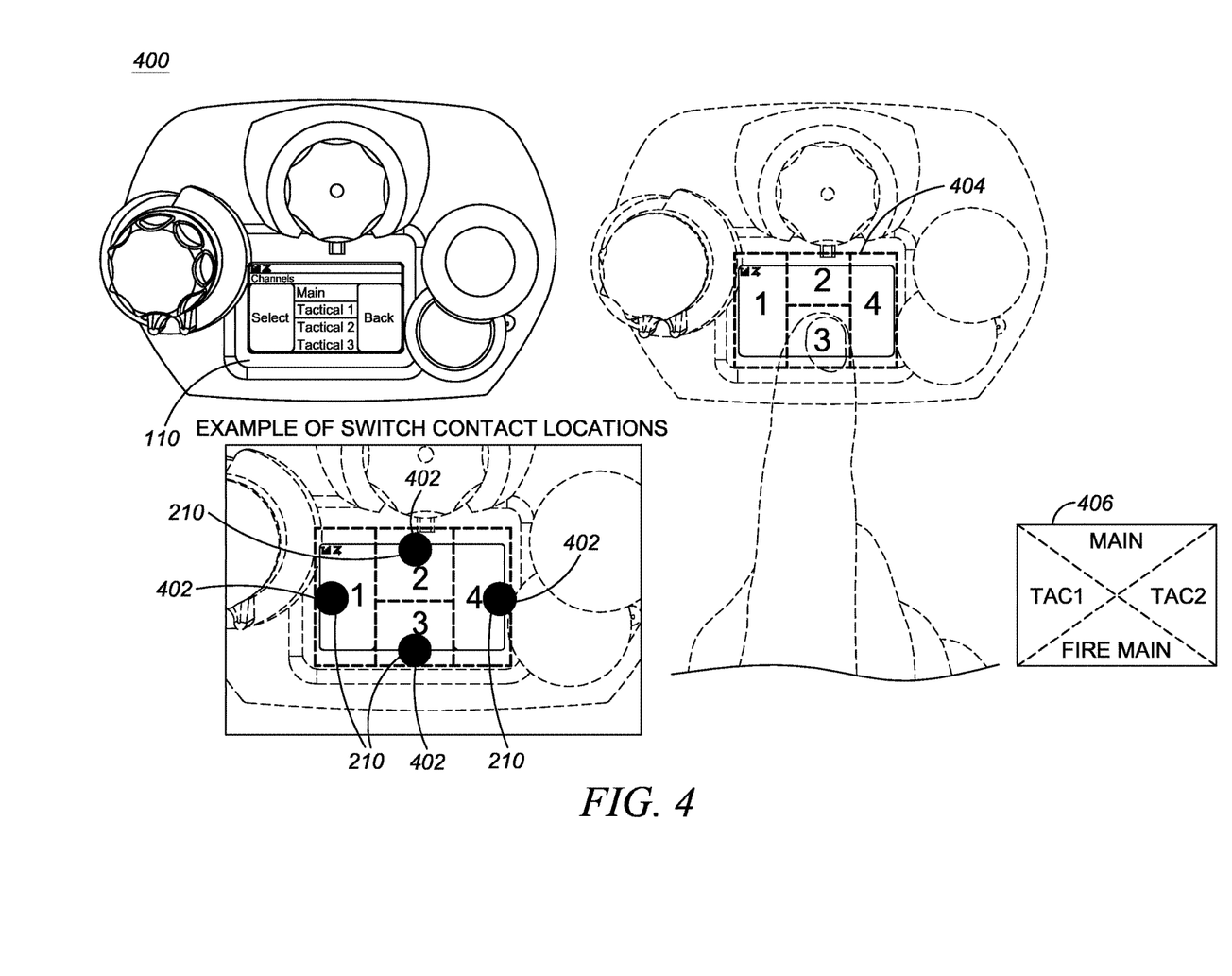
FIG. 4 shows an example of a user interface for a display formed in accordance with the various embodiments.
Figure 5:
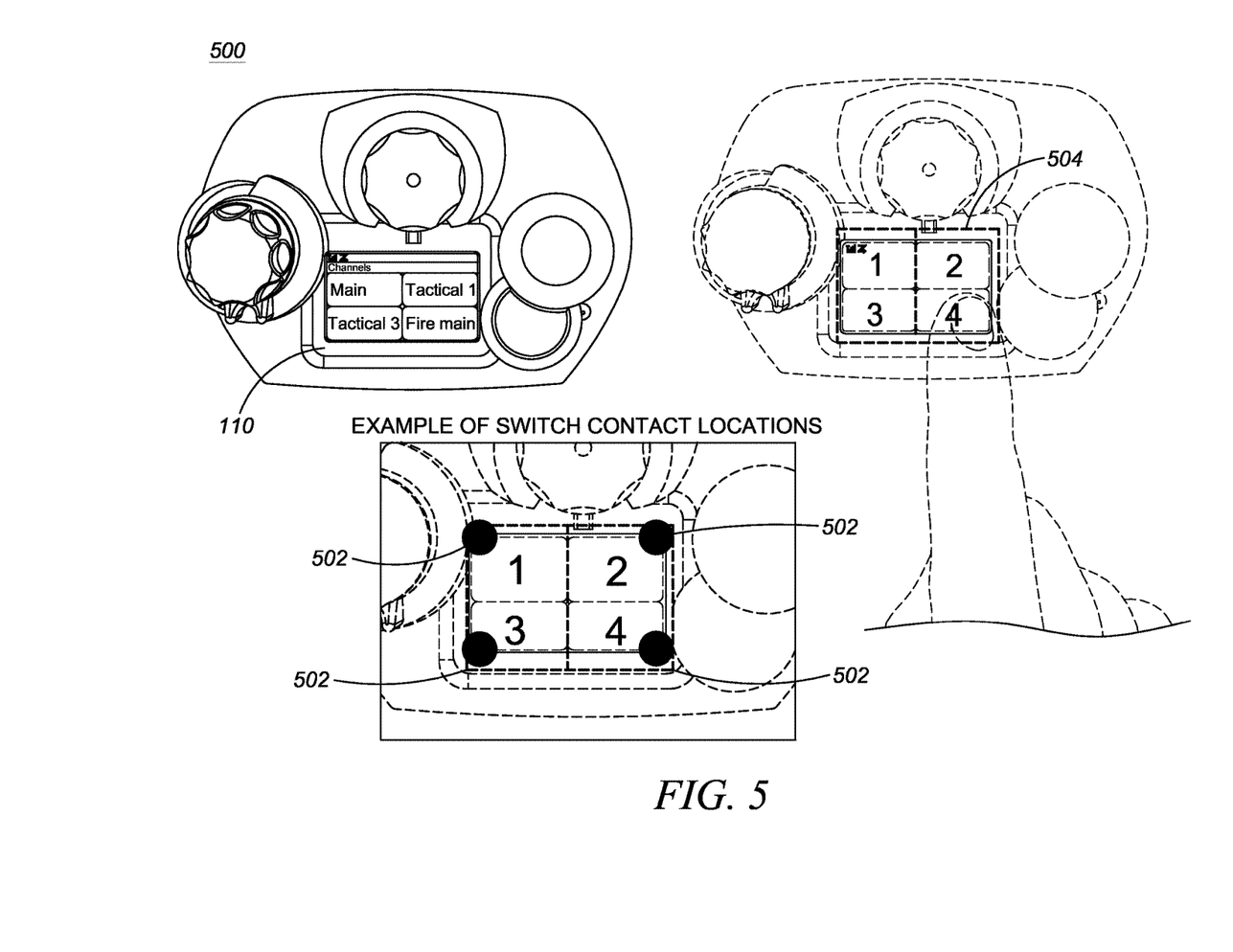
FIG. 5 shows another user interface example for a display formed in accordance with the various embodiments.

The placement of the dome switches 210 provides for different actuation zones, as will be further described in conjunction with FIGS. 4 and 5. In cross-sectional view 302, the compliant actuation substrate 212 comprising the plurality of actuator posts 220 can be seen. Each actuator post 220 aligns with a dome switch 210 of the pcb flex 230.

Hence, FIGS. 2 and 3 have provided for an electronic device, such as a portable radio, comprising a housing and a chassis with a movable display 110 coupled therebetween. The movable display 110 provides a tactile display interface. The display 110 comprises glass lens 104 and the display sub-assembly 204 coupled to the glass lens. The perimeter seal 208 couples the glass lens 104 to the chassis cradle. The switch contacts 210 are coupled to the bottom surface of the display sub-assembly. The substrate 212, with actuator posts 220 disposed thereon, is seated within the chassis cradle, such that each actuator post aligns beneath a respective switch contact 210. Sealing is maintained by perimeter seal 208 during switch actuation.

FIG. 4 shows a user interface example for the display 110 providing a tactile display interface 400 in accordance with the various embodiments. In this view, the four rear facing dome switches 210 are arranged at mid-span locations 402 on the back of the display. This mid-span placement 402 provides for four actuation zones (1, 2, 3, 4) which are configured on an actuation zone display menu layout, such as examples 404 and 406 shown in FIG. 4. Thus, the menu layouts 404 and 406 are aligned with the actuation zones. Applications may also be embodied with fewer actuations zones, if desired, by using fewer contact switches. Sealing by perimeter seal 208 is maintained throughout actuation. The mid-span switch placement 402 provides for side to side rocking movement of the display.

FIG. 5 shows another user interface example for the display 110 in accordance with the various embodiments. The user interface of FIG. 5 corresponds with that shown in FIG. 1. In this view 500, the four rear facing dome switches 210 are arranged along opposing corners 502 of the bottom surface of the display 110. This four corner placement 502 allows for four actuation zones (1, 2, 3, 4) which are configured on a display menu layout 504 as shown in FIG. 5. Thus, the menu layout 504 is aligned with the actuation zones. The corner placement 502 allows for a symmetric four quadrant type of user interface. The four corner switch placement 502 provides for diagonal rocking movement of the display.

All of the embodiments provide for a plurality of switch contacts 210 disposed between the back surface of the display sub-assembly 204 and the base 214 of the internal frame 218 whereby the display and glass is moveable relative to the internal frame resulting in actuation of a single mechanical switch in response to the application of sufficient and localized force to the display. Applications may also be embodied with fewer actuations zones, if desired, by using fewer contact switches and actuators.

In all of the embodiments, the sealing provided by perimeter seal 208 is maintained throughout actuation. The movable display 110 has been provided by mounting the display having a lens to the internal frame having a base, the internal frame having a flat perimeter surface suitable for sealing the glass lens 104 to the frame using a perimeter seal 208, such as an adhesive pad. The display and switch contacts are thus protected against moisture intrusion and drop impact. The movable display and actuation zones provide an improved tactile user interface, even with a non-touch type display.

Figure 6:
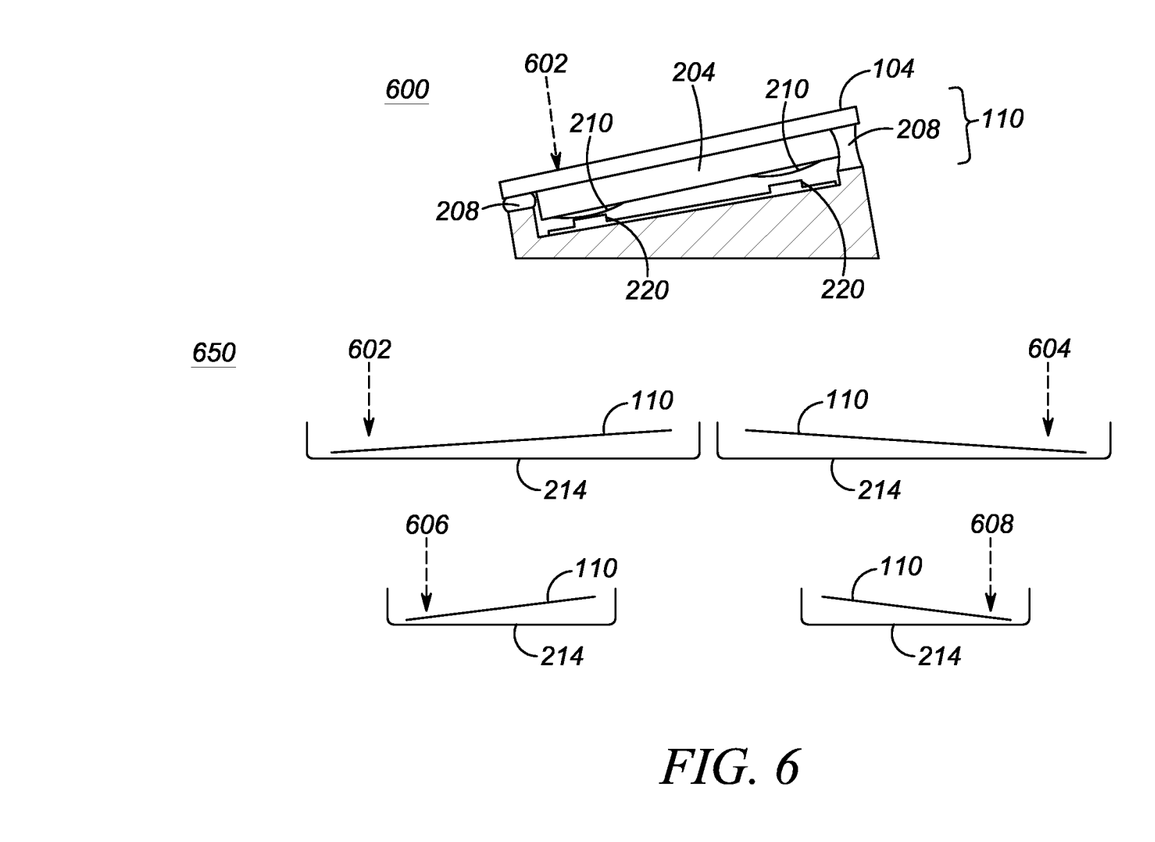
FIG. 6 shows a simplified representation for a mid-span switch contact location of FIG. 4.

FIG. 6 shows a simplified representation for the mid-span switch contact location of FIG. 4. As seen in this view in response to the display 110 being pressed at location 602, contact switch 210 is actuated by actuator post 220. The perimeter seal 208 deflects or flattens in response to the press. The other contacts switches of the plurality of switches do not make contact. View 650, shows a summary of the rocking motions provided by the display 110. A press 602 at a mid-span width location of the display 110 rocks the assembly in a first direction. A press 604 at an opposing mid-span width location of the display 110 rocks the assembly in a second direction. A press 606 at a mid-span length location of the display 110 rocks the assembly in a third direction. A press 608 at an opposing mid-span length location of the display 110 rocks the assembly in a fourth direction. The display 110 can thus be rocked from side to side as well as forward and backward. Sealing by perimeter seal 208 is maintained throughout actuation as shown in view 600 where, for example an adhesive pad, stretches and deflects while maintaining the seal without any gap.

In accordance with the various embodiments, for the switch contact placement shown in FIG. 5, the rocking in response to corner presses moves diagonally from corner to corner, thereby also providing rocking in four directions. The various embodiments of display 110 have provided for a sealed display environment even as a user presses an actuation zone of the display and the display rocks.

Accordingly, there has been provided an improved display assembly providing and a tactile display interface. The underlying actuator and switch system transmits localized feedback to the user. The sealing of the glass to the internal frame is maintained during switch actuation, even under cold temperatures making the display assembly of the various embodiments well suited for electronic products, such as portable radios, operating under extreme temperature conditions. The movable display incorporated within a portable radio is responsive and provides tactile feedback to both gloved and non-gloved usage.

The assembly formed in accordance with the various embodiments advantageously operates using reduced software development and processing capacity as compared to a touch screen display. Unlike touch screens which require users to visually locate actuation zones and make contact on narrowly defined locations, the actuations zones provided by the various embodiments allows for gross motor movements and location consistency. These locations combined with perimeter tactile locators beneficially enable usage under visually impaired conditions, such as darkness or smoky environments encountered in public safety applications.

The display formed in accordance with the various embodiments requires no flexing thereby allowing for rugged materials to be used to protect the viewing area from impact and abrasion without affecting touch capability. Unlike touch screens, the display interface formed in accordance with the various embodiments is not dependent on the actual screen surface for tactile response.

The tactile display interface formed in accordance with the various embodiments, offers IP67 capability which forms part of the IP Code, Ingress Protection Rating, sometimes also referred to as International Protection Rating, which classifies and rates the degree of protection provided against the intrusion (including body parts such as hands and fingers), dust, accidental contact, and water in mechanical casings and with electrical enclosures. It is published by the International Electrotechnical Commission (IEC).

While described in terms of a non-touch type display for ruggedized environments, the tactile user interface provided by the plurality of switches and rocking motion of the display formed in accordance with the various embodiments could also be utilized in a touch-screen display environment to provide a combination of touch and tactile interface if desired.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An electronic device, comprising:
a housing;
a chassis having a chassis cradle with an opening;
a display assembly between the housing and the chassis cradle, the display assembly, comprising:
a glass lens;
a display sub-assembly comprising a non-touch type display adhesively coupled to the glass lens;
a perimeter seal for coupling the glass lens to the chassis cradle;
a plurality of switch contacts coupled to a bottom surface of the non-touch type display;
a compliant actuation substrate seated within the chassis cradle, the compliant actuation substrate having a plurality of actuators disposed thereon, the plurality of actuators aligned beneath the switch contacts, the display assembly being configured to move and provide tactile feedback in response to being pressed, and being configured to travel a predetermined distance, the predetermined distance being sufficient to actuate one of the plurality of switch contacts coupled to the bottom surface of the non-touch type display by one of the plurality of actuators disposed on the compliant actuation substrate in response to the glass lens of the display assembly being pressed;
and
an interconnect ribbon flex for interconnecting the display sub-assembly to internal workings of the electronic device through the opening of the chassis cradle.

2. The electronic device of claim 1, further comprising:
a perimeter seal coupled to the glass lens and seated within the chassis cradle.

3. The electronic device of claim 2, wherein the perimeter seal coupled within the chassis cradle provides for a predetermined amount of travel of the display sub-assembly in conjunction with sealing.

4. The electronic device of claim 1, wherein the chassis cradle comprises an internal frame and a base.

5. The electronic device of claim 1, wherein the non-touch type display comprises a liquid crystal display (LCD) sub-assembly.

6. The electronic device of claim 1, wherein the substrate provides compliance to allow deflection for actuating the switch.

7. The electronic device of claim 1, wherein the plurality of switch contacts comprise a plurality of dome switches, and the plurality of actuators comprises a plurality of actuator posts.

8. The electronic device of claim 1, wherein the display assembly provides a user interface displaying user selectable zones.

9. The electronic device of claim 8, wherein each user selectable zone corresponds with a separate underlying switch contact.

10. The electronic device of claim 1, wherein each user selectable zone is displayed as a quadrant, each quadrant corresponding to a separate underlying switch contact.

11. The electronic device of claim 1, wherein the plurality of switch contacts are located at opposing corners of the display sub-assembly.

12. The electronic device of claim 1, wherein the plurality of switch contacts are located along mid-lines of the non-touch type display.

13. The electronic device of claim 1, wherein the chassis cradle comprises an internal frame and a base having an opening providing a pass-through for an electronic flex interconnect of the non-touch type display for interconnection to electronics of the electronic device.

14. The electronic device of claim 1, wherein the compliant actuation substrate seated within the chassis cradle having the plurality of actuators disposed thereon further acts as a shock absorber pad for impact.

15. The electronic device of claim 1, wherein the electronic radio is a public safety radio.

16. The electronic device of claim 1, wherein the plurality of switch contacts coupled to the bottom surface of the non-touch type display comprise dome switches which deflect in response to being actuated by the plurality of actuators of the compliant actuation substrate.

17. An assembly for a display, comprising:
a frame having a base;
a glass lens;
a non-touch type display adhesively coupled to the glass lens;
a perimeter seal adhesively coupled between the glass lens and the frame;
a flex substrate adhesively coupled to the non-touch display, the flex substrate having at least one switch contact disposed thereon;
a interconnect ribbon flex coupled to the flex substrate;
a compliant substrate seated upon the base within the frame, the compliant substrate having at least one actuator aligned beneath the at least one switch contact, the assembly being configured to move and provide tactile feedback in response to being pressed, the non-touch type display being configured for travelling over a predetermined distance, the predetermined distance being sufficient to actuate the at least one switch contact of the flex substrate by the at least one actuator disposed on the compliant substrate in response to the glass lens being pressed; and
an opening within the base, the opening providing a pass-through for the interconnect ribbon flex.

18. The assembly for a display of claim 17, wherein the compliant actuation substrate seated upon the base of the frame having at least one actuator further acts as a shock absorber pad for impact.

19. The assembly for a display of claim 17, the at least one switch contact comprises at least one dome switch which deflects against the at least one actuator of the compliant substrate.

20. An electronic device, comprising:
an internal frame having a base and a flat perimeter surface;

a moveable non-touch display with glass lens mounted within the internal frame;

a perimeter seal for sealing the glass lens to the internal frame along the flat perimeter surface;

a plurality of mechanical switches disposed between a back surface of the movable non-touch display and the base of the internal frame, the moveable non-touch display and glass being moveable relative to the internal frame resulting in actuation of a single mechanical switch in response to an application of sufficient and localized force to the moveable display;

the perimeter seal maintaining sealing during switch actuation;

a display flex printed circuit board (pcb) adhesively coupled to the moveable non-touch display, the plurality of mechanical switches being an integral part of the display flex pcb;

a compliant actuation pad disposed between the base of the internal frame and the plurality of mechanical switches, the compliant actuation pad having a plurality of actuators aligned beneath the plurality of mechanical switches, the movable non-touch display being configured to travel over a predetermined distance, the predetermined distance being sufficient to actuate one of the plurality of mechanical switches by one of the plurality of actuators of the compliant actuation pad in response to the glass lens being pressed;

an interconnect ribbon flex coupled to the display flex pcb; and an opening within the base providing a pass-through for the interconnect ribbon flex, the interconnect ribbon flex and plurality of mechanical switches being sealed by the perimeter seal of the internal frame.

21. The electronic device of claim 20, wherein the plurality of mechanical switches comprises:

four switch contacts located at opposite corners of the moveable display.

22. The electronic device of claim 20, wherein the plurality of mechanical switches comprises:

four switch contacts located at mid-span edges of the moveable non-touch display.

23. The electronic device of claim 20, wherein the plurality of mechanical switches further provide tactile feedback to the non-touch type display.

24. The electronic device of claim 20, wherein the moveable display rocks back and forth from side to side.

25. The electronic device of claim 20, wherein the moveable display rocks diagonally from corner to corner.

26. The electronic device of claim 20, wherein the electronic device comprises a portable radio.

27. The electronic device of claim 26, wherein the movable display of the portable radio is responsive to both gloved and non-gloved usage.

28. The electronic device of claim 20, wherein the compliant actuation pad disposed between the base of the internal frame and the plurality of mechanical switches further acts as a shock absorber pad for impact.

29. The electronic device of claim 20, wherein the electronic radio is a public safety radio.

30. The electronic device of claim 20, wherein the plurality of mechanical switches comprises a plurality of dome switches which deflect in response to being actuated by the plurality of actuators of the compliant actuation pad.

* * * * *